United States Patent
Chen et al.

(10) Patent No.: US 10,622,501 B2
(45) Date of Patent: Apr. 14, 2020

(54) CO-EXTRUDED ONE-TIME-FORMED SOLAR CELL MODULE BACKBOARD IN THREE-LAYER STRUCTURE

(71) Applicant: Cybrid Technologies Inc., Suzhou (CN)

(72) Inventors: Hongye Chen, Suzhou (CN); Lei Wang, Suzhou (CN); Xiaoping Wu, Suzhou (CN); Uno Keiichi, Otsu (JP); Takabatake Hiroshi, Suzhou (CN)

(73) Assignee: Cybrid Technologies Inc., Suzhou (CN)

( * ) Notice: Subject to any disclaimer, the term of this patent is extended or adjusted under 35 U.S.C. 154(b) by 0 days.

(21) Appl. No.: 15/525,949

(22) PCT Filed: Nov. 9, 2016

(86) PCT No.: PCT/CN2016/105236
§ 371 (c)(1),
(2) Date: May 10, 2017

(87) PCT Pub. No.: WO2017/181655
PCT Pub. Date: Oct. 26, 2017

(65) Prior Publication Data
US 2019/0181284 A1    Jun. 13, 2019

(30) Foreign Application Priority Data

Apr. 18, 2016  (CN) .......................... 2016 1 0236772

(51) Int. Cl.
*H01L 31/049*    (2014.01)
*B32B 27/08*    (2006.01)
(Continued)

(52) U.S. Cl.
CPC .............. *H01L 31/049* (2014.12); *B32B 7/10* (2013.01); *B32B 27/08* (2013.01); *B32B 27/20* (2013.01);
(Continued)

(58) Field of Classification Search
CPC ... H01L 31/049; H01L 31/0481; B32B 27/34; B32B 27/30; B32B 27/32; B32B 27/20;
(Continued)

(56) References Cited

U.S. PATENT DOCUMENTS

2011/0048512 A1*  3/2011  Chu .................. B32B 27/08
                                                  428/339
2012/0028006 A1*  2/2012  Yamaguchi ............. B32B 27/32
                                                  428/212
(Continued)

FOREIGN PATENT DOCUMENTS

CN    102779874 A  * 11/2012
CN    103066141 A  *  4/2013

OTHER PUBLICATIONS

[NPL-1] Fu (CN 103066141 A); Apr. 2013 (EPO machine translation to English). (Year: 2013).*
(Continued)

*Primary Examiner* — David Sample
*Assistant Examiner* — Donald M Flores, Jr.
(74) *Attorney, Agent, or Firm* — Wayne & Ken, LLC; Tony Hom

(57) ABSTRACT

The present invention discloses a co-extruded one-time-formed solar cell module backboard in a three-layer structure. The backboard is formed by co-extruding three layers: a middle layer located in the middle as well as an outer layer and an inner layer located at two sides of the middle layer, and has high water resisting capability, high reflective rate, good long-term aging resistance performances of hydrolysis
(Continued)

resistance, UV resistance and heat resistance and good recoverability and environmental protection performance. Compared with the prior art, the backboard has better water resisting ability, higher reflectivity, better long-term aging resistance performances of hydrolysis resistance, UV resistance and heat resistance, better recoverability and environmental protection performance and lower cost. Compared with a backboard in a co-extruded structure in the prior art, the backboard of the present invention has better heat resistance, better dimensional stability and higher mechanical breaking strength.

10 Claims, 2 Drawing Sheets

(51) Int. Cl.
　　　*B32B 27/20* 　　(2006.01)
　　　*B32B 27/32* 　　(2006.01)
　　　*B32B 27/34* 　　(2006.01)
　　　*B32B 27/30* 　　(2006.01)
　　　*H01L 31/048* 　(2014.01)
　　　*B32B 7/10* 　　(2006.01)
　　　*B32B 27/36* 　　(2006.01)

(52) U.S. Cl.
　　　CPC ............ *B32B 27/30* (2013.01); *B32B 27/302* (2013.01); *B32B 27/308* (2013.01); *B32B 27/32* (2013.01); *B32B 27/325* (2013.01); *B32B 27/34* (2013.01); *B32B 27/365* (2013.01); *H01L 31/0481* (2013.01); *B32B 2250/03* (2013.01); *B32B 2250/24* (2013.01); *B32B 2264/102* (2013.01); *B32B 2307/206* (2013.01); *B32B 2307/306* (2013.01); *B32B 2307/406* (2013.01); *B32B 2307/416* (2013.01); *B32B 2307/54* (2013.01); *B32B 2307/71* (2013.01); *B32B 2307/712* (2013.01); *B32B 2307/714* (2013.01); *B32B 2307/7246* (2013.01); *B32B 2307/7265* (2013.01); *B32B 2307/732* (2013.01); *B32B 2307/734* (2013.01); *B32B 2457/12* (2013.01); *Y10T 428/24* (2015.01); *Y10T 428/24942* (2015.01); *Y10T 428/24967* (2015.01)

(58) Field of Classification Search
　　　CPC . B32B 27/08; B32B 2250/24; B32B 2250/03; B32B 2457/12; B32B 2307/71; B32B 2264/102; B32B 2307/7265; B32B 2307/714; B32B 2307/206; B32B 2307/306; B32B 2307/406; B32B 2307/416; B32B 2307/54; B32B 2307/712; B32B 2307/7246; B32B 2307/732; B32B 2307/734; B32B 7/10; B32B 27/302; B32B 27/308; B32B 27/325; B32B 27/365; B32B 3/12; B32B 27/06; B32B 27/18; B32B 2457/10; Y10T 428/24967; Y10T 428/24; Y10T 428/24942
　　　See application file for complete search history.

(56) References Cited

U.S. PATENT DOCUMENTS

2013/0209795 A1* 8/2013 Liu .................. B32B 27/08
　　　　　　　　　　　　　　　　　　　428/337
2014/0144499 A1* 5/2014 Huang ............. H01L 31/18
　　　　　　　　　　　　　　　　　　　136/256

OTHER PUBLICATIONS

[NPL-2] Liang (CN 102779874 A); Nov. 2012 (EPO machine translation to English). (Year: 2012).*

* cited by examiner

CO-EXTRUDED ONE-TIME-FORMED SOLAR CELL MODULE BACKBOARD IN THREE-LAYER STRUCTURE

TECHNICAL FIELD

The present invention relates to a co-extruded one-time-formed solar cell module backboard in a three-layer structure.

BACKGROUND OF THE INVENTION

A solar cell module is usually a laminated structure and mainly includes a glass layer, an Ethylene/Vinyl Acetate (EVA) encapsulation layer, a silicon cell piece, an EVA encapsulation layer and a solar cell module backboard that are sequentially arranged, wherein the silicon cell piece is sealed and wrapped by two layers of EVA adhesive films. The solar cell module backboard has a main function of electrical insulation, can improve the mechanical strength of the solar cell module and can prevent water vapor from permeating into a sealing layer to affect the service life and the power generation efficiency of the cell piece. Since the solar cell module backboard is arranged on the outermost side of the solar cell module, the backboard is required to have good environmental erosion resistance. Therefore, the manufactured solar cell module backboard must have good wet and heat ageing resistance, high temperature resistance, hydrolysis resistance, corrosion resistance, Ultraviolet (UV) irradiation resisting ability and water resisting capability and have high light reflection capacity at the side of a cell, so as to improve the power generation efficiency of the cell and further lower the cost.

In the prior art, the solar cell backboard is mainly formed by compositing three layers of film materials: a fluorine-containing film with the thickness of 0.020-0.040 mm, a Polyester (PET) film base layer with the thickness of 0.100-0.300 mm and an EVA or polyolefine film or Polyamide (PA) with the thickness of 0.0200-0.180 mm or modified polypropylene by adhesive. The backboard has the following defects that: the backboard is thicker, so that the heat conduction efficiency and the heat resistance are poorer, the reflective rate is low, so the power generation efficiency of the cell is affected; the UV resistance is low, so the material of the surface layer of the cell piece is pulverized too early, yellows, cracks, ages and fails; the water vapor permeation rate is high, so a Potential Induced Degradation (PID) phenomenon is caused; and snail trails are induced, so the power generation efficiency is reduced; the repair for the module is difficult; and the backboard is expensive.

SUMMARY OF THE INVENTION

For overcoming the defects of the prior art, the present invention aims to provide a solar cell module backboard in a three-layer structure, which has high water resistance ratio, high reflective rate, good long-term ageing resistance and good environmental protection performance. The backboard consists of three films: a middle layer which is located in the middle as well as an outer layer and an inner layer which are located at the two sides of the middle layer by using a dynamic crosslinking extrusion technology which is also called a reactive crosslinking extrusion technology. The solar cell module backboard (4) is formed at one time by co-extruding three films and functional fillers by the reactive crosslinking extrusion technology and has high water resisting ability, high reflective rate, good long-term ageing resistance performance of hydrolysis resistance, UV resistance and heat resistance, good dimensional thermal stability and good recoverability and environmental protection performance. The solar cell module backboard is in the three-layer structure comprising a core base layer made of a crosslinked polymerized alloy film, the outer layer which is located at one side of an atmospheric surface thereof and consists of a co-extruded crosslinked polymerized alloy layer and the inner layer which is located at the other side thereof, i.e., the side of a cell piece and consists of co-extruded crosslinked polymerized alloy. Compared with the prior art, the backboard has better water resisting ability, higher reflective rate, better long-term aging resistance performances of hydrolysis resistance, UV resistance and heat resistance, better dimensional thermal stability, better recoverability and environmental protection performance and lower cost. Compared with a backboard in a co-extruded structure in the prior art, the backboard of the present invention has better heat resistance, better dimensional stability and higher mechanical breaking strength.

In the present invention, low-cost polyolefin polymerized resins, reactive functional groups grafted by a grafting technology and polymerized resins with reactive groups capable of reacting with the grafted functional groups are blended to carry out a crosslinking reaction in an extrusion process, thereby realizing a crosslinked network, improving heat resistance, enhancing mechanical strength and improving dimensional stability; meanwhile, the present invention uses the polymerized resins with the reactive groups in each of the three layers as compatilizer, thereby enhancing the binding force between every two adjacent layers. Meanwhile, the crosslinked network is used for improving the hardness and the capabilities of friction resistance, scratching resistance, acid and alkali resistance, solvent resistance, ammonia resistance and salt spray resistance of the outer layer on the surface.

In order to achieve the above purposes, the present invention adopts the technical solution as follows: the co-extruded one-time-formed solar cell module backboard in the three-layer structure is characterized in that the solar cell module backboard (4) is formed by co-extruding the three films: a middle layer (3) which is located in the middle as well as an outer layer (1) and an inner layer (2) which are located at the two sides of the middle layer (3) by using the dynamic crosslinking extrusion technology which is also called the reactive crosslinking extrusion technology and a reactive extrusion technology.

The middle layer (3) as well as the outer layer (1) and the inner layer (2) which are located at the two sides of the middle layer (3) are processed by the dynamic crosslinking extrusion technology which is also called the reactive crosslinking extrusion technology.

Namely, a dense molecular network is formed through crosslinking of polymers inside each of the layers and between every two adjacent layers in a co-extrusion process, so as to achieve the purposes of improving heat resistance, heat stability and mechanical strength and enhancing the binding force between the middle layer (3) and the outer layer (1) and between the middle layer (3) and the inner layer (2), wherein the outer layer (1) and the inner layer (2) are located at the two sides of the middle layer (3). Meanwhile, the compatilizer compatible with the outer layer (1) and the inner layer (2) and added in the middle layer (3) is used, thereby achieving the purposes of enhancing the binding force between the middle layer (3) and the outer layer (1) and between the middle layer (3) and the inner layer (2), wherein the outer layer (1) and the inner layer (2) are located at the two sides of the middle layer (3).

The middle layer (3) is composed of a polymerized network plastic alloy obtained from a crosslinking reaction between two or more of a component A, a component B, a component C, a component D and a functional filler in a co-extrusion process, the component A is composed of one or two of Linear Low Density Polyethylene (LLDPE), Low-Density Polyethylene (LDPE), Medium-Density Polyethylene (MDPE), High-Density Polyethylene (HDPE), Ultrahigh Molecular Weight Polyethylene (UHMWPE), Styrene-Ethylene/Butylene-Styrene block copolymer (SEBS), Ethylene Octene Copolymerized Polyolefin Elastomers (POE), Ethylene pentene copolymerized POE, Homo-Polypropylene (HOPP), Co-Polypropylene (COPP), a mixture of HOPP and COPP, Polystyrene (PS), Polyphenylene Sulfide (PPS), Polyphenylene Oxide (PPO), Polyamide (PA) (one or more of PA, PA6, PA11, PA12, PA66, PA610, PA612, PA1010 and PA1212), Polymethyl Methacrylate (PMMA), Polyvinyl Butyral (PVB), Polycarbonate (PC) and Cyclic Olefin Copolymer (COC) and the like;

the component B is composed of one or two of LLDPE-g-Glycidyl Methacrylate (GMA), LDPE-g-GMA, MDPE-g-GMA, HDPE-g-GMA, UHMWPE-g-GMA, SEBS-g-GMA, HOPP-g-GMA, COPP-g-GMA, PS-g-GMA, PPO-g-GMA, ethylene octene copolymerized POE-g-GMA, ethylene pentene copolymerized POE-g-GMA, PC-g-GMA, Ethylene Propylene Diene Monomer (EPDM)-g-GMA, LLDPE-g-Maleic Anhydride (MAH), LDPE-g-MAH, MDPE-g-MAH, HDPE-g-MAH, UHMWPE-g-MAH, SEBS-g-MAH, HOPP-g-MAH, COPP-g-MAH, PS-g-MAH. PPO-g-MAH, ethylene octene copolymerized POE-g-MAH, ethylene pentene copolymerized POE-g-MAH, PC-g-MAH, EPDM-g-MAH and COC and the like;

the component C is composed of one or two of polymers selected from: PA (one or more of PA, PA6, PA11, PA12, PA66, PA610, PA612, PA1010 and PA1212), PMMA, PVB, phenoxy resin, crystalline polyester polyol and the like;

the component D is nylon polyolefin graft copolymer, wherein the nylon polyolefin graft copolymer may be composed of one or two of polyolefin and nylon polyolefin graft copolymer Apollya® of ARKEMA company;

the functional fillers are used for enhancing reflective performance, heat dispersion, flame retardant property and color decoration performance, and the inorganic fillers are selected from one or a mixture of at least two of $TiO_2$, $Al_2O_3$, aluminium hydroxide, talcum powder, $SiO_2$, $CaCO_3$, carbon black, mica powder, barium sulfate, diatomaceous earth, pumice powder and diamond powder; and the middle layer (3) comprises the following components by weight ratio: 0-99% of the component A (preferably, 0-90%), 0.5%-99% of the component B (preferably, 0.5%-80%), 0.5%-99% of the component C (preferably, 0.5%-90%), 0-99% of the component D (preferably, 0-50%) and 0.5%-90% of the functional fillers (preferably, 0.5%-30%).

The outer layer (1) is composed of a polymer network plastic alloy obtained from a crosslinking reaction between two or more of a component E, a component F, a component G, and a functional filler in a co-extrusion process, wherein the component E is composed of one or two of polymers selected from: LLDPE, LDPE, MDPE, HDPE, UHMWPE, SEBS, ethylene octene copolymerized POE, ethylene pentene copolymerized POE, PA (one or more of PA, PA6, PA11, PA12, PA66, PA610, PA612 and PA1010), PMMA, PVB, nylon polyolefin graft copolymer, COC and the like;

the component F is composed of one or two of polymers selected from: LLDPE-g-GMA, LDPE-g-GMA, MDPE-g-GMA, HDPE-g-GMA, UHMWPE-g-GMA, SEBS-g-GMA, ethylene octene copolymerized POE-g-GMA, ethylene pentene copolymerized POE-g-GMA, EPDM-g-GMA, LLDPE-g-MAH, LDPE-g-MAH, MDPE-g-MAH, HDPE-g-MAH, UHMWPE-g-MAH, SEBS-g-MAH, ethylene octene copolymerized POE-g-MAH, ethylene pentene copolymerized POE-g-MAH, EPDM-g-MAH and nylon polyolefin graft copolymer which may be nylon polyolefin graft copolymer Apolhya® of ARKEMA company and the like;

the component G is composed of one or two of polymers selected from: PA (one or more of PA, PA6, PA11, PA12, PA66, PA610, PA612, PA1010 and PA1212), PMMA, PVB, phenoxy resin and crystalline polyester polyol;

the functional fillers are used for enhancing reflective performance, heat dispersion, flame retardant property and color decoration performance, and the inorganic fillers are selected from one or a mixture of at least two of $TiO_2$, $Al_2O_3$, aluminium hydroxide, talcum powder, $SiO_2$, $CaCO_3$, carbon black, mica powder, barium sulfate, diatomaceous earth, pumice powder and diamond powder; and the outer layer (1) comprises following components by weight ratio: 0-99% of the component E (preferably, 0-90%), 0.5%-99% of the component F (preferably, 10-90%), 0.5%-99% of the component G (preferably, 0.5%-90%) and 0.5%-90% of the functional fillers (preferably, 1%-40%).

The inner layer (2) is composed of a polymer network plastic alloy obtained from a crosslinking reaction between two or more of a component H, a component J, a component K, and a functional filler in a co-extrusion process, wherein the component H is composed of one or two of polymers selected from: LLDPE, LDPE, MDPE, HDPE, UHMWPE, SEBS, ethylene octene copolymerized POE, ethylene pentene copolymerized POE, PA (one or more of PA, PA6, PA11, PA12, PA66, PA610 and PA612), PMMA, PVB, nylon polyolefin graft copolymer, COC and the like;

the component J is composed of one or two of polymers selected from: LLDPE-g-GMA, LDPE-g-GMA, MDPE-g-GMA, HDPE-g-GMA, UHMWPE-g-GMA, SEBS-g-GMA, Ethylene octene copolymerized POE-g-GMA, ethylene pentene copolymerized POE-g-GMA, EPDM-g-GMA, LLDPE-g-MAH, LDPE-g-MAH, MDPE-g-MAH, HDPE-g-MAH, UHMWPE-g-MAH, SEBS-g-MAH, Ethylene octene copolymerized POE-g-MAH, ethylene pentene copolymerized POE-g-MAH, EPDM-g-MAH, nylon polyolefin graft copolymer which may be formed by one or two of nylon polyolefin graft copolymer Apolhya®, of ARKEMA company and the like;

the component K is composed of one or two of polymers selected from: PA (one or more of PA, PA6, PA11, PA12, PA66, PA610, PA612, PA1010 and PA1212), PMMA, PVB, phenoxy resin and crystalline polyester polyol;

the functional fillers are used for enhancing reflective performance, heat dispersion, flame retardant property and color decoration performance, and the inorganic fillers are selected from one or a mixture of at least two of $TiO_2$, $Al_2O_3$, aluminium hydroxide, talcum powder, $SiO_2$, $CaCO_3$, carbon black, mica powder, barium sulfate, diatomaceous earth, pumice powder and diamond powder; and the inner layer (2) comprises the following components by weight ratio: 0-99% of the component H (preferably, 0-90%), 0.5%-99% of the component J (preferably, 10-90%), 0.5%-99% of the component K (preferably, 0.5%-90%) and 0.5%-90% of the functional fillers (preferably, 1%-40%).

The thickness of the middle layer (3) is 0.005 mm-0.500 mm, the thickness of the outer layer (1) is 0.010 mm-0.100 mm, and the thickness of the inner layer (2) is 0.010 mm-0.100 mm. The surface gloss of the outer layer (1) is 1-99 and is preferably 5-90, wherein the angle of projection of a light ray for measuring the surface gloss is 60 degrees; the surface gloss of the inner layer (2) is 1-99 and is preferably 5-90, wherein the angle of projection of a light ray for measuring the surface gloss is 60 degrees; and a gloss measuring method complies with the following standards: ASTMD523, ASTMD1455, ASTMC346, ASTMC584, ASTMD2457, ENISO2813, DIN67530, ENISO7668, JISZ8741, MFT30064, TAPPIT480, GB9754, GB/T13891, GB7706, GB8807 and the like. The surface reflectivity of the inner layer (2) is 1%-99% and is preferably 2%-99%, wherein the range of wavelength of a light ray for measuring the reflectivity is 400-1100 nm.

DETAILED DESCRIPTION OF THE INVENTION

Embodiment 1

Figure 1:
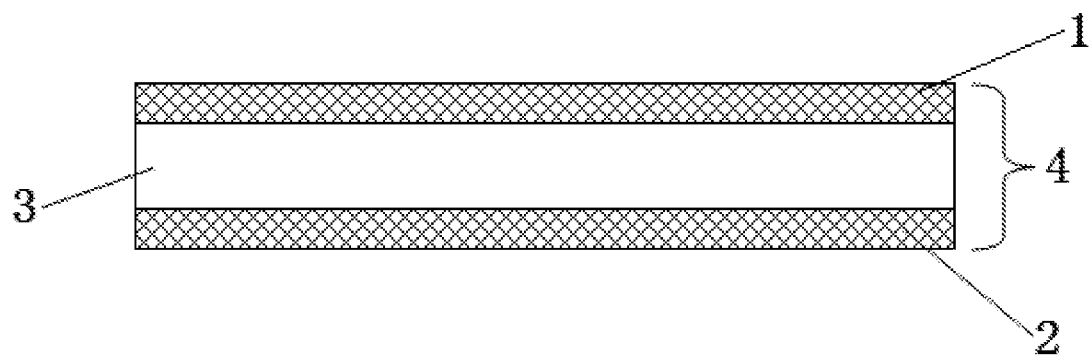
FIG. 1 is a structural schematic diagram of a co-extruded one-time-formed solar cell module backboard of the present invention.

FIG. 1 is a structural schematic diagram of a solar cell module backboard (4) in a three-layer structure. The solar cell module backboard (4) comprises a middle layer (3) which is located in the middle as well as an outer layer (1) and an outer layer 2 which are located at the two sides of the middle layer, and is made by three-layer co-extrusion one-time continuous production, namely, hybrid polymerized films are formed by a high-temperature co-extrusion film making process, wherein the outer layer (1) comprises raw materials (by mass percent, similarly hereinafter) of 88% of PA12 and 12% of $TiO_2$ and is 0.050 mm in thickness;

the chemical formula of the outer layer (1) is: $[NH-(CH_2)_{11}-CO]_n$; the inner layer (2) comprises raw materials of 19% of EVA, 69% of LLDPE and 12% of $TiO_2$ and is 0.050 mm in thickness;

the chemical formula of the inner layer (2) is: $(C_2H_4) \times (C_4H_8)_2 + (C_2H_4)_n$, wherein the chemical formula of EVA is: $(C_2H_4) \times (C_4H_6O_2)_y$, and the chemical formula of LLDPE is: $(C_2H_4)_6$; and the middle layer (3) comprises raw materials of 98% of HOPP and 2% of $TiO_2$ and is 0.250 mm in thickness, wherein the chemical formula of HOPP is: $(C_3H_6)_n$.

The hybrid polymerized films are formed by the high-temperature co-extrusion film making process.

Embodiment 2

FIG. 1 is a structural schematic diagram of a solar cell module backboard (4) in a three-layer structure. The solar cell module backboard (4) comprises a middle layer (3) which is located in the middle as well as an outer layer (1) and an outer layer 2 which are located at the two sides of the middle layer, wherein the outer layer (1) comprises raw materials of 88% of PA12 and 12% of $TiO_2$ and is 0.050 mm in thickness;

the chemical formula of PA12 is: $[NH-(CH_2)_{11}-CO]_n$;

the inner layer (2) comprises raw materials of 88% of PA12 and 12% of $TiO_2$ and is 0.050 mm in thickness;

the middle layer (3) comprises raw materials of 98% of PA12 and 2% of $TiO_2$ and is 0.250 mm in thickness;

Hybrid polymerized films are formed by a high-temperature co-extrusion film making process.

Embodiment 3

FIG. 1 is a structural schematic diagram of a solar cell module backboard (4) in a three-layer structure. The solar cell module backboard (4) comprises a middle layer (3) which is located in the middle as well as an outer layer (1) and an outer layer 2 which are located at the two sides of the middle layer, and is made by three-layer co-extrusion one-time continuous production, wherein the outer layer (1) comprises raw materials of 65% of HDPE-g-GMA, 23% of PA12 and 12% of $TiO_2$ and is 0.050 mm in thickness, and the chemical formula of HDPE is: $[-CH_2-CH_2-]_n$;

the inner layer (2) comprises raw materials of 65% of HDPE-g-GMA, 23% of PA112 and 12% of $TiO_2$ and is 0.050 mm in thickness; and the middle layer (3) comprises raw materials of 58% of HOPP, 20% of PP-g-GMA, 20% of PA12 and 2% of $TiO_2$ and is 0.250 mm in thickness. A crosslinking reaction is carried out on a part of raw materials by a high-temperature co-extrusion film making process, so as to form hybrid polymerized alloy films.

In an actual manufacturing process, the three layers of materials are processed by the high-temperature co-extrusion film making process at one time; one hybrid polymerized alloy film is formed at each layer, while every two adjacent layers are fused, crosslinked and adhered together by the compatibility of polymers and the crosslinking reaction, so as to form an integrated polymerized alloy film.

Embodiment 4

FIG. 1 is a structural schematic diagram of a solar cell module backboard (4) in a three-layer structure. The solar cell module backboard (4) comprises a middle layer (3) which is located in the middle as well as an outer layer (1) and an outer layer 2 which are located at the two sides of the middle layer, and is made by three-layer co-extrusion one-time continuous production, wherein the outer layer (1) comprises raw materials of 64% of HDPE-g-GMA, 24% of PA12 and 12% of $TiO_2$ and is 0.050 mm in thickness;

the inner layer (2) comprises raw materials of 20% of LLDPE, 48% of POE, 10% of POE-g-GMA, 10% of PA12 and 12% of $TiO_2$ and is 0.050 mm in thickness; and the middle layer (3) comprises raw materials of 58% of HOPP, 20% of PP-g-GMA, 20% of PA12 and 2% of $TiO_2$ and is 0.250 mm in thickness. A crosslinking reaction is carried out on a part of raw materials by a high-temperature co-extrusion film making process, so as to form hybrid polymerized alloy films.

In an actual manufacturing process, the three layers of materials are processed by the high-temperature co-extrusion film making process at one time, one hybrid polymerized alloy film is formed at each layer, and every two adjacent layers are fused, crosslinked and adhered together by the compatibility of polymers and the crosslinking reaction, so as to form an integrated polymerized alloy film.

Embodiment 5

FIG. 1 is a structural schematic diagram of a solar cell module backboard (4) in a three-layer structure. The solar cell module backboard (4) comprises a middle layer (3) which is located in the middle as well as an outer layer (1) and an outer layer 2 which are located at the two sides of the middle layer, and is made by three-layer co-extrusion one-time continuous production, wherein the outer layer (1) comprises raw materials of 64% of HDPE-g-GMA, 24% of PA12 and 12% of $TiO_2$ and is 0.050 mm in thickness, wherein the chemical formula of HDPE is: $[—CH_2—CH_2-]_n$;

the inner layer (2) comprises raw materials of 64% of HDPE-g-GMA, 24% of PA12 and 12% of $TiO_2$ and is 0.050 mm in thickness; and the middle layer (3) comprises raw materials of 70% of HDPE-g-GMA, 24% of PA12 and 6% of $TiO_2$ and is 0.250 mm in thickness. A crosslinking reaction is carried out on a part of raw materials by a high-temperature co-extrusion film making process, so as to form hybrid polymerized alloy films.

In an actual manufacturing process, the three layers of materials are processed by the high-temperature co-extrusion film making process at one time, one hybrid polymerized alloy film is formed at each layer, and every two adjacent layers are fused, crosslinked and adhered together by the compatibility of polymers and the crosslinking reaction, so as to form an integrated polymer alloy film.

Embodiment 6

FIG. 1 is a structural schematic diagram of a solar cell module backboard (4) in a three-layer structure. The solar cell module backboard (4) comprises a middle layer (3) which is located in the middle as well as an outer layer (1) and an outer layer 2 which are located at the two sides of the middle layer, and is made by three-layer co-extrusion one-time continuous production, wherein the outer layer (1) comprises raw materials of 64% of HDPE-g-GMA, 24% of PA12 and 12% of $TiO_2$ and is 0.050 mm in thickness;

the inner layer (2) comprises raw materials of 64% of HDPE-g-GMA, 24% of PA12 and 12% of $TiO_2$ and is 0.050 mm in thickness; and the middle layer (3) comprises raw materials of 60% of HOPP/COPP-g-GMA, 16% of PA12, 4% of $TiO_2$ and 20% of HDPE-g-GMA and is 0.250 mm in thickness.

A crosslinking reaction is carried out on a part of raw materials by a high-temperature co-extrusion film making process, so as to form hybrid polymerized alloy films.

In an actual manufacturing process, the three layers of materials are processed by the high-temperature co-extrusion film making process at one time, one hybrid polymerized alloy film is formed at each layer, and every two adjacent layers are fused, crosslinked and adhered together by the compatibility of polymers and the crosslinking reaction, so as to form an integrated polymerized alloy film.

Embodiment 7

FIG. 1 is a structural schematic diagram of a solar cell module backboard (4) in a three-layer structure. The solar cell module backboard (4) comprises a middle layer (3) which is located in the middle as well as an outer layer (1) and an outer layer 2 which are located at the two sides of the middle layer, and is made by three-layer co-extrusion one-time continuous production, wherein the outer layer (1) comprises raw materials of 64% of HDPE-g-GMA, 24% of PA12 and 12% of $TiO_2$ and is 0.050 mm in thickness;

the inner layer (2) comprises raw materials of 64% of HDPE-g-GMA, 24% of PA12 and 12% of $TiO_2$ and is 0.050 mm in thickness; and the middle layer (3) comprises raw materials of 60% of HOPP, 26% of COC (Cyclic Olefin Copolymer) and 4% of $TiO_2$ and is 0.250 mm in thickness, and the chemical formula of COC is:

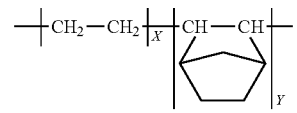

A crosslinking reaction is carried out on a part of raw materials by a high-temperature co-extrusion film making process, so as to form hybrid polymerized alloy films.

In an actual manufacturing process, the three layers of materials are processed by the high-temperature co-extrusion film making process at one time, one hybrid polymerized alloy film is formed at each layer, and every two adjacent layers are fused, crosslinked and adhered together by the compatibility of polymers and the crosslinking reaction, so as to form an integrated polymerized alloy film.

Embodiment 8

FIG. 1 is a structural schematic diagram of a solar cell module backboard (4) in a three-layer structure. The solar cell module backboard (4) comprises a middle layer (3) which is located in the middle as well as an outer layer (1) and an outer layer 2 which are located at the two sides of the middle layer, and is made by three-layer co-extrusion one-time continuous production, wherein the outer layer (1) comprises raw materials of 43% of nylon polyolefin graft copolymer Apolhya®, 30% of HDPE-g-GMA, 15% of PA12 and 12% of $TiO_2$ and is 0.050 mm in thickness;

the inner layer (2) comprises raw materials of 43% of nylon polyolefin graft copolymer Apolhya®, 30% of HDPE-g-GMA, 15% of PA12 and 12% of $TiO_2$ and is 0.050 mm in thickness; and the middle layer (3) comprises raw materials of 46% of HOPP, 30% of HOPP/COPP-g-GMA, 10% of nylon polyolefin graft copolymer Apolhya®, 10% of PA12 and 4% of $TiO_2$ and is 0.250 mm in thickness. A crosslinking reaction is carried out on a part of raw materials by a high-temperature co-extrusion film making process, so as to form hybrid polymerized alloy films.

In an actual manufacturing process, the three layers of materials are processed by the high-temperature co-extrusion film making process at one time, one hybrid polymerized alloy film is formed at each layer, and every two adjacent layers are fused, crosslinked and adhered together by the compatibility of polymers and the crosslinking reaction, so as to form an integrated polymerized alloy film.

Embodiment 9

FIG. 1 is a structural schematic diagram of a solar cell module backboard (4) in a three-layer structure. The solar cell module backboard (4) comprises a middle layer (3) which is located in the middle as well as an outer layer (1) and an outer layer 2 which are located at the two sides of the middle layer, and is made by three-layer co-extrusion one-time continuous production, wherein the outer layer (1) comprises raw materials of 43% of nylon polyolefin graft copolymer Apolhya®, 30% of HDPE-g-GMA, 15% of PA12 and 12% of $TiO_2$ and is 0.050 mm in thickness;

the inner layer (2) comprises raw materials of 43% of nylon polyolefin graft copolymer Apolhya®, 30% of HDPE-g-GMA, 15% of PA12 and 12% of $TiO_2$ and is 0.050 mm in thickness; and the middle layer (3) comprises raw materials of 75% of HOPP/COPP-g-GMA, 21% of PA12 and 4% of $TiO_2$ and is 0.250 mm in thickness. A crosslinking reaction is carried out on a part of raw materials by a high-temperature co-extrusion film making process, so as to form hybrid polymerized alloy films.

In an actual manufacturing process, the three layers of materials are processed by the high-temperature co-extrusion film making process at one time, one hybrid polymerized alloy film is formed at each layer, and every two adjacent layers are fused, crosslinked and adhered together by the compatibility of polymers and the crosslinking reaction, so as to form an integrated polymerized alloy film.

Embodiment 10

Figure 2:
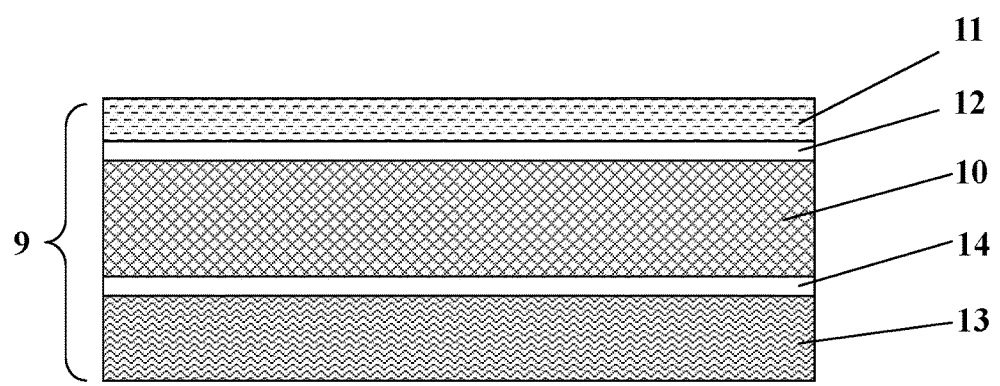
FIG. 2 is a structural schematic diagram of a solar cell module composed by the co-extruded one-time-formed solar cell module backboard of the present invention.

FIG. 2 is a structural schematic diagram of a solar cell module backboard (9) in a common structure type. The solar cell module backboard (9) is in a five-layer structure, which comprises a middle layer (10) which is located in the middle, a fluorine-containing film which is located at an outer layer (11), an adhesive layer (12) which is used for adhering the outer layer (11) and the middle layer (10), an inner layer 13) which is located at the side of a cell piece and an adhesive layer (14) which is used for adhering the inner layer (13) and the middle layer (10), and the five layers are adhered together by a compounding method, wherein the outer layer (11) is made of the fluorine-containing film and is 0.025 mm in thickness; the inner layer (13) is made of LLDPE and is 0.095 mm in thickness; the middle layer (10) is made of a PET film and is 0.250 mm in thickness; and the adhesive layer (12) is 0.015 mm in thickness, and the adhesive layer (14) is 0.015 mm in thickness. Assessment and test results are shown in Table 1.

TABLE 1

Assessment and Test Results of Solar Cell Module Backboards in Embodiments 1-10

| Test Item | Specification Judgment Value | Embodiment 1 | Embodiment 2 | Embodiment 3 | Embodiment 4 | Embodiment 5 |
|---|---|---|---|---|---|---|
| Overall Thickness (mm) | | 350 | 350 | 350 | 350 | 350 |
| Initial Breaking Tensile Strength (MPa) | MD ≥ 30<br>TD ≥ 30 | MD = 23<br>TD = 18 | MD = 55<br>TD = 51 | MD = 24<br>TD = 20 | MD = 21<br>TD = 19 | MD = 25<br>TD = 21 |
| Breaking Tensile Strength (MPa) after DH2000 Hours | None | MD = 18<br>TD = 12 | MD = 38<br>TD = 35 | MD = 20<br>TD = 15 | MD = 17<br>TD = 15 | MD = 20<br>TD = 16 |
| Attenuation Rate (%) | None | MD = 21.74<br>TD = 33.33 | MD = 30.91<br>TD = 31.37 | MD = 16.67<br>TD = 25 | MD = 19.05<br>TD = 21.05 | MD = 20<br>TD = 23.81 |
| Assessment | | Δ | Δ | ○ | ◎ | ◎ |
| Initial Breaking Tensile Rate (%) | MD ≥ 50<br>TD ≥ 50 | MD = 80<br>TD = 75 | MD = 200<br>TD = 168 | MD = 67<br>TD = 56 | MD = 62<br>TD = 53 | MD = 60<br>TD = 52 |
| Initial Breaking Tensile Rate (%) after DH2000 Hours | None | MD = 58<br>TD = 54 | MD = 108<br>TD = 97 | MD = 58<br>TD = 46 | MD = 53<br>TD = 42 | MD = 51<br>TD = 41 |
| Attennation Rate (%) | None | MD = 27.5<br>TD = 28.00 | MD = 46.00<br>TD = 42.26 | MD = 13.43<br>TD = 17.85 | MD = 14.52<br>TD = 20.76 | MD = 15<br>TD = 21.57 |
| Assessment | | Δ | Δ | ◎ | ○ | ○ |
| Inner-Layer Reflectivity (%) (400-1100 nm) | ≥80 | 90% | 91% | 92% | 90.5% | 90.8% |
| Assessment | | ◎ | ◎ | ◎ | ◎ | ◎ |
| Dimension Stability (%) (150° C., 30 Minutes) | MD ≤ 1.5<br>TD ≤ 1.5 | MD = 1.46<br>TD = 1.40: | MD = 1.40<br>TD = 1.20 | MD = 0.85<br>TD = 0.70 | MD = 1.08<br>TD = 1.02 | MD = 0.95<br>TD = 0.92 |
| Assessment | | Δ | Δ | ○ | ○ | ○ |
| Water Vapor Permeation Rate (g/$m^2$ day) | ≤2.5 | 1.03 | 3.5 | 0.75 | 0.8 | 0.9 |
| Assessment | | ◎ | X | ◎ | ◎ | ◎ |
| Heat Resistance (TI) | ≥90 | 90 | 105 | 105 | 105 | 125 |
| Assessment | | ○ | ◎ | ◎ | ◎ | ◎ |
| Breakdown Voltage Resistance (KV) | ≥15 | 17.6 | 17.2 | 18.7 | 18.2 | 18.5 |
| Assessment | | ○ | ○ | ○ | ○ | ○ |
| Partial Discharge (V) (PDV) (in the air) | ≥1000 | 1020 | 1112 | 1280 | 1272 | 1260 |
| Assessment | | ○ | ○ | ○ | ○ | ○ |
| UV and Yellowing Resistance | Yellowing index: ΔYI < 5 after 300 KWh of irradiation on the surface of the inner layer | 5.1 | 5 | 3 | 2.2 | 2.1 |
| Assessment | | X | Δ | ○ | ◎ | ◎ |
| UV and Yellowing | Yellowing index: | 5.2 | 5 | 3 | 2.0 | 2.1 |

TABLE 1-continued

Assessment and Test Results of Solar Cell Module Backboards in Embodiments 1-10

| Resistance | ΔYI < 5 after 300 KWh of irradiation on the surface of the outer layer | | | | |
|---|---|---|---|---|---|
| Assessment | X | Δ | ○ | ◎ | ◎ |
| General Assessment | X | Δ | ○ | ◎ | ◎ |

| Embodiment 6 | Embodiment 7 | Embodiment 8 | Embodiment 9 | Embodiment 10 | Standard of Testing Method |
|---|---|---|---|---|---|
| 350 | 350 | 350 | 350 | 350 | |
| MD = 39 | MD = 34 | MD = 32 | MD = 38 | MD = 106 | GB/T |
| TD = 32 | TD = 31 | TD = 31 | TD = 33 | TD = 92 | 31034-2014 |
| MD = 31 | MD = 29 | MD = 28 | MD = 32 | MD = 15 | |
| TD = 25 | TD = 26 | TD = 25 | TD = 27 | TD = 12 | |
| MD = 20.51 | MD = 14.71 | MD = 12.5 | MD = 15.79 | MD = 85.85 | |
| TD = 21.88 | TD = 16.13 | TD = 19.36 | TD = 18.19 | TD = 86.96 | |
| ◎ | ◎ | ◎ | ◎ | X | |
| MD = 63 | MD = 61 | MD = 65 | MD = 67 | MD = 108 | GB/T |
| TD = 53 | TD = 56 | TD = 58 | TD = 59 | TD = 100 | 31034-2014 |
| MD = 50 | MD = 52 | MD = 53 | MD = 55 | MD = 13 | GB/T |
| TD = 43 | TD = 45 | TD = 48 | TD = 49 | TD = 9 | 31034-2014 |
| MD = 20.64 | MD = 14.75 | MD = 18.46 | MD = 17.91 | MD = 87.96 | |
| TD = 18.87 | TD = 19.64 | TD = 17.24 | TD = 16.95 | TD = 91 | |
| ○ | ○ | ○ | ○ | X | |
| 91.2% | 91.2% | 91% | 91.5% | 85% | Demands of mainstream customers |
| ◎ | ◎ | ◎ | ◎ | Δ | |
| MD = 0.80 | MD = 0.80 | MD = 0.70 | MD = 0.66 | MD = 1.05 | GB/T |
| TD = 0.75 | TD = 0.75 | TD = 0.69 | TD = 0.60 | TD = 0.8 | 31034-2014 |
| ○ | ○ | ○ | ○ | ○ | |
| 0.92 | 0.92 | 0.80 | 0.81 | 1.8 | GB/T 31034-2014 Infrared method |
| ◎ | ◎ | ◎ | ◎ | Δ | |
| 125 | 125 | 125 | 125 | 105 | IEC60216-5 |
| ◎ | ◎ | ◎ | ◎ | Δ | |
| 18.8 | 18.9 | 19 | 18.5 | 18 | GB/T 31034-2014 |
| ○ | ○ | ○ | ○ | ○ | |
| 1310 | 1310 | 1320 | 1301 | 1021 | GB/T 31034-2014 |
| ○ | ○ | ○ | ○ | ○ | |
| 2.1 | 2.2 | 2.5 | 2.2 | 4 | ASTM E313 |
| ◎ | ◎ | ◎ | ◎ | Δ | |
| 2.1 | 2.2 | 2.6 | 2.5 | 2 | ASTM E313 |
| ◎ | ◎ | ◎ | ◎ | ◎ | |
| ◎ | ◎ | ◎ | ◎ | Δ | |

The embodiments 4-9 have the best comprehensive assessments. Therefore, it is concluded that the performance of the embodiments using the dynamic crosslinking technology are obviously improved, is obviously more excellent than a backboard in a same structure not using the technology and is also better than currently widely-used backboards in different structures.

Notes: ◎=optimal
○=excellent
Δ=good
x=poor

From the above embodiments, it is observed that the solar cell module backboard in the three-layer structure in the present invention has excellent performance of high heat dissipation rate, high reflective rate, high water resistance ratio, good long-term ageing resistance and the like. Compared with the prior art, the backboard has better water resisting ability, higher reflective rate, better long-term aging resistance performance of hydrolysis resistance, UV resistance and heat resistance, better recoverability and environmental protection performance and lower cost. Compared with a backboard in a structure in the prior art, which is directly formed by co-extrusion without the crosslinking reaction, the backboard of the present invention has better heat resistance, better dimensional stability and higher mechanical breaking strength after the dynamic crosslinking technology or the reactive extrusion technology is used.

The above embodiments are only used for explaining the technical conceptions and characteristics of the present invention, for the purpose that those skilled in the art can understand the contents of the present invention and implement the present invention according to the contents, and the above embodiments do not limit the protection scope of the present invention. Any equivalent change or modification made according to the spiritual substance of the present invention shall be included in the protection scope of the present invention.

What is claimed is:

1. A co-extruded one-time-formed solar cell module backboard in a three-layer structure, characterized in that: the backboard is formed by co-extruding a middle layer (3), an outer layer (1) and an inner layer (2); wherein the middle layer (3) is located in the middle and the outer layer (1) and the inner layer (2) are located at two sides of the middle layer (3);

the middle layer (3) is composed of a polymer network plastic alloy obtained from a crosslinking reaction between two or more of a component A, a component B, a component C, a component D and a first functional filler in a co-extrusion process;

the component A is composed of one or two of, Polystyrene (PS), Polyphenylene Sulfide (PPS), Polyphenylene Oxide (PPO), Polymethyl Methacrylate (PMMA), Polyvinyl Butyral (PVB), and Cyclic Olefin Copolymer (COC);

the component B is composed of one or two of Linear Low-Density Polyethylene (LLDPE)-g-Glycidyl Methacrylate (GMA), Low-Density Polyethylene (LDPE)-g-GMA, Medium-Density Polyethylene (MDPE)-g-GMA, High-Density Polyethylene (HDPE)-g-GMA, Ultrahigh Molecular Weight Polyethylene (UHMWPE)-g-GMA, Styrene-Ethylene/Butylene-Styrene block copolymer (SEBS)-g-GMA, Homo-Polypropylene (HOPP)-g-GMA, Co-Polypropylene (COPP)-g-GMA, PS-g-GMA, PPO-g-GMA, ethylene octene copolymerized Polyolefin Elastomers (POE)-g-GMA, ethylene pentene copolymerized POE-g-GMA, Polycarbonate (PC)-g-GMA, Ethylene Propylene Diene Monomer (EPDM)-g-GMA and COC;

the component C is composed of one or two of PMMA, PVB, phenoxy resin and crystalline polyester polyol;

the component D is nylon polyolefin graft copolymer; and the first functional filler is selected from one or more of $Al_2O_3$, aluminium hydroxide, $CaCO_3$, barium sulfate, diatomaceous earth, pumice powder and diamond powder; wherein the middle layer (3) comprises the following components by weight ratio: 0-99% of the component A, 0.5%-99% of the component B, 0.5%-99% of the component C, 0-99% of the component D and 0.5%-90% of the first functional filler.

2. The co-extruded one-time-formed solar cell module backboard in the three-layer structure of claim 1, characterized in that: the middle layer (3) comprises the following components by weight ratio: 0-90% of the component A, 0.5%-80% of the component B, 0.5%-90% of the component C, 0-50% of the component D and 0.5%-30% of the first functional filler.

3. The co-extruded one-time-formed solar cell module backboard in the three-layer structure of claim 1, wherein the outer layer (1) is composed of a polymer network plastic alloy obtained from a crosslinking reaction between two or more of a component E, a component F, a component G, and a second functional filler in a co-extrusion process; the component E is composed of one or two of LLDPE, LDPE, MDPE, HDPE, UHMWPE, SEBS, ethylene octene copolymerized POE, ethylene pentene copolymerized POE, PMMA, PVB and COC;

the component F is composed of one or two of LLDPE-g-GMA, LDPE-g-GMA, MDPE-g-GMA, HDPE-g-GMA, UHMWPE-g-GMA, SEBS-g-GMA, ethylene octene copolymerized POE-g-GMA, ethylene pentene copolymerized POE-g-GMA, EPDM-g-GMA, LLDPE-g-Maleic Anhydride (MAH), LDPE-g-MAH, MDPE-g-MAH, HDPE-g-MAH, UHMWPE-g-MAH, SEBS-g-MAH, ethylene octene copolymerized POE-g-MAH, ethylene pentene copolymerized POE-g-MAH, EPDM-g-MAH and nylon polyolefin graft copolymer;

the component G is composed of one or two of, PMMA, PVB, phenoxy resin and crystalline polyester polyol; and the second functional filler is selected from one or more of $Al_2O_3$, aluminium hydroxide, $SiO_2$, $CaCO_3$, carbon black, barium sulfate, diatomaceous earth, pumice powder and diamond powder.

4. The co-extruded one-time-formed solar cell module backboard in the three-layer structure of claim 3, wherein the outer layer (1) comprises the following components by weight ratio: 0-99% of the component E, 0.5%-99% of the component F, 0.5%-99% of the component G and 0.5%-90% of the second functional filler.

5. The co-extruded one-time-formed solar cell module backboard in the three-layer structure of claim 4, wherein the outer layer (1) comprises the following components by weight ratio: 0-90% of the component E, 0.5%-90% of the component F, 0.5%-90% of the component G and 1%-40% of the second functional filler.

6. The co-extruded one-time-formed solar cell module backboard in the three-layer structure of claim 1, wherein the inner layer (2) is composed of a polymer network plastic alloy obtained from a crosslinking reaction between two or more of a component H, a component J, a component K, and a third functional filler in a co-extrusion process;

wherein the component H is composed of one or two of LLDPE, LDPE, MDPE, HDPE, UHMWPE, SEBS, ethylene octene copolymerized POE, ethylene pentene copolymerized POE, PMMA, PVB and COC;

the component J is composed of one or two of LLDPE-g-GMA, LDPE-g-GMA, MDPE-g-GMA, HDPE-g-GMA, UHMWPE-g-GMA, SEBS-g-GMA, ethylene octene copolymerized POE-g-GMA, ethylene pentene copolymerized POE-g-GMA, EPDM-g-GMA, LLDPE-g-MAH, LDPE-g-MAH, MDPE-g-MAH, HDPE-g-MAH, UHMWPE-g-MAH, SEBS-g-MAH, ethylene octene copolymerized POE-g-MAH, ethylene pentene copolymerized POE-g-MAH, EPDM-g-MAH and nylon polyolefin graft copolymer;

the component K is composed of one or two of PMMA, PVB, phenoxy resin and crystalline polyester polyol; and the third functional filler is selected from one or more of $Al_2O_3$, aluminium hydroxide, $SiO_2$, $CaCO_3$, carbon black, barium sulfate, diatomaceous earth, pumice powder and diamond powder.

7. The co-extruded one-time-formed solar cell module backboard in the three-layer structure of claim 6, wherein the inner layer (2) comprises the following components by weight ratio: 0-99% of the component H, 0.5%-99% of the component J, 0.5%-99% of the component K and 0.5%-90% of the third functional filler.

8. The co-extruded one-time-formed solar cell module backboard in the three-layer structure of claim 7, wherein the inner layer (2) comprises the following components by weight ratio: 0-90% of the component H, 0.5%-90% of the component J, 0.5%-90% of the component K and 1%-40% of the third functional filler.

9. The co-extruded one-time-formed solar cell module backboard in the three-layer structure of claim 1, wherein a thickness of the middle layer (3) is 0.010 mm-0.500 mm, the thickness of the outer layer (1) is 0.010 mm-0.100 mm, and the thickness of the inner layer (2) is 0.010 mm-0.100 mm.

10. The co-extruded one-time-formed solar cell module backboard in the three-layer structure of claim 1, wherein when an angle of projection of a light ray for measuring a gloss is 60 degrees, a surface gloss of the outer layer (1) is 1-99, and the surface gloss of the inner layer (2) is 1-99; and when a range of wavelength of a light ray for measuring a reflectivity is 400-1100 nm, a surface reflectivity of the inner layer (2) is 1%-99%.

* * * * *